United States Patent
Kuo

(10) Patent No.: US 8,134,380 B2
(45) Date of Patent: Mar. 13, 2012

(54) TEST PROBE STRUCTURE

(75) Inventor: Yung Hsin Kuo, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 287 days.

(21) Appl. No.: 12/433,217

(22) Filed: Apr. 30, 2009

(65) Prior Publication Data

US 2010/0127721 A1    May 27, 2010

Related U.S. Application Data

(60) Provisional application No. 61/118,094, filed on Nov. 26, 2008.

(51) Int. Cl.
*G01R 31/00* (2006.01)
*G01R 31/20* (2006.01)

(52) U.S. Cl. .............. 324/756.06; 324/754.07

(58) Field of Classification Search . 324/754.01–754.14, 754.18, 755.01–755.11, 324/756.01–756.07

See application file for complete search history.

(56) References Cited

U.S. PATENT DOCUMENTS

| | | | |
|---|---|---|---|
| 6,501,343 B2 * | 12/2002 | Miller | 333/33 |
| 6,562,636 B1 * | 5/2003 | Richmond et al. | 438/14 |
| 6,784,674 B2 * | 8/2004 | Miller | 324/754.07 |
| 7,227,371 B2 * | 6/2007 | Miller | 324/754.14 |
| 7,339,385 B2 * | 3/2008 | Takasu et al. | 324/756.04 |
| 7,417,446 B2 * | 8/2008 | Hayden et al. | 324/756.06 |
| 2003/0006796 A1 * | 1/2003 | Stark | 324/765 |
| 2007/0167083 A1 * | 7/2007 | Mineo | 439/638 |

* cited by examiner

*Primary Examiner* — Huy Q Phan
*Assistant Examiner* — Joshua Benitez
(74) *Attorney, Agent, or Firm* — Haynes and Boone, LLP

(57) ABSTRACT

The present disclosure provides a method for testing an integrated circuit having a load impedance. The method includes generating a first test signal having a first frequency and a second test signal having a second frequency, wherein the second frequency is greater than the first frequency, transmitting the first test signal to a substrate having a board circuit operable to process the first signal, transmitting the second test signal to a substrate, wherein the substrate includes an impedance matching circuit operable to transform the load impedance of the integrated circuit into a desired impedance for the second frequency, and sending the first and second test signals to the integrated circuit via the substrate.

18 Claims, 7 Drawing Sheets

TEST PROBE STRUCTURE

PRIORITY DATA

This application claims priority to Provisional Application Ser. No. 61/118,094, filed on Nov. 26, 2008, entitled "TEST PROBE CARD," the entire disclosure of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices. These devices may then be packaged and sold as IC chips.

As technologies continue to advance, often times IC chips are used in a high frequency environment, such as a radio frequency (RF) environment. In addition, as the semiconductor devices get smaller and the functionalities of the chips continue to increase, an IC chip may have a small area and yet have many input and output (I/O) pins operable to control and program the IC chip. Consequently, the pitch size—or the distance between the pins—becomes smaller as well. Current technologies may not meet the simultaneous demands of establishing proper electrical connections to all the pins of an IC chip having a small pitch size and testing the IC chip's high frequency response characteristics. Accordingly, a method and device to efficiently and effectively test the high frequency response characteristics of an IC chip having a small pitch size is needed.

SUMMARY

One of the broader forms of an embodiment of the present invention involves a method for testing an integrated circuit having a load impedance. The method includes generating a first test signal having a first frequency and a second test signal having a second frequency, wherein the second frequency is greater than the first frequency; providing the first test signal to a first substrate, the first substrate having a circuit operable to process the first test signal; providing the second test signal to a second substrate having an impedance matching circuit, the impedance matching circuit being operable to transform the load impedance into a desired impedance for the second frequency; and sending the first and second test signals to the integrated circuit via the second substrate.

Another one of the broader forms of an embodiment of the present invention involves an apparatus for testing an integrated circuit having a load impedance and a plurality of pins separated by a first pitch. The apparatus includes a first substrate operable to process a first test signal having a first frequency; a second substrate coupled to the first substrate, the second substrate being operable to process a second test signal having a second frequency, wherein the first frequency does not exceed the second frequency; and an impedance matching circuit located on the second substrate, wherein the impedance matching circuit is operable to transform the load impedance into a desired impedance for the second frequency.

Yet another one of the broader forms of an embodiment of the present invention involves a system for testing an integrated circuit having a load impedance and a plurality of pins separated by a first pitch. The system includes a tester having a source impedance and operable to generate a first test signal having a first frequency and a second test signal having a second frequency for testing the integrated circuit, wherein the second frequency is greater than the first frequency; a first substrate coupled to the tester and operable to process the first test signal; a second substrate coupled to the first substrate and operable to process the second test signal, wherein the second substrate includes an impedance matching circuit operable to transform the load impedance into a desired impedance for the second frequency; and a probe head having a plurality of probe sensors operable to transmit and receive the first and second test signals, wherein the probe sensors couple the second substrate to the integrated circuit.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
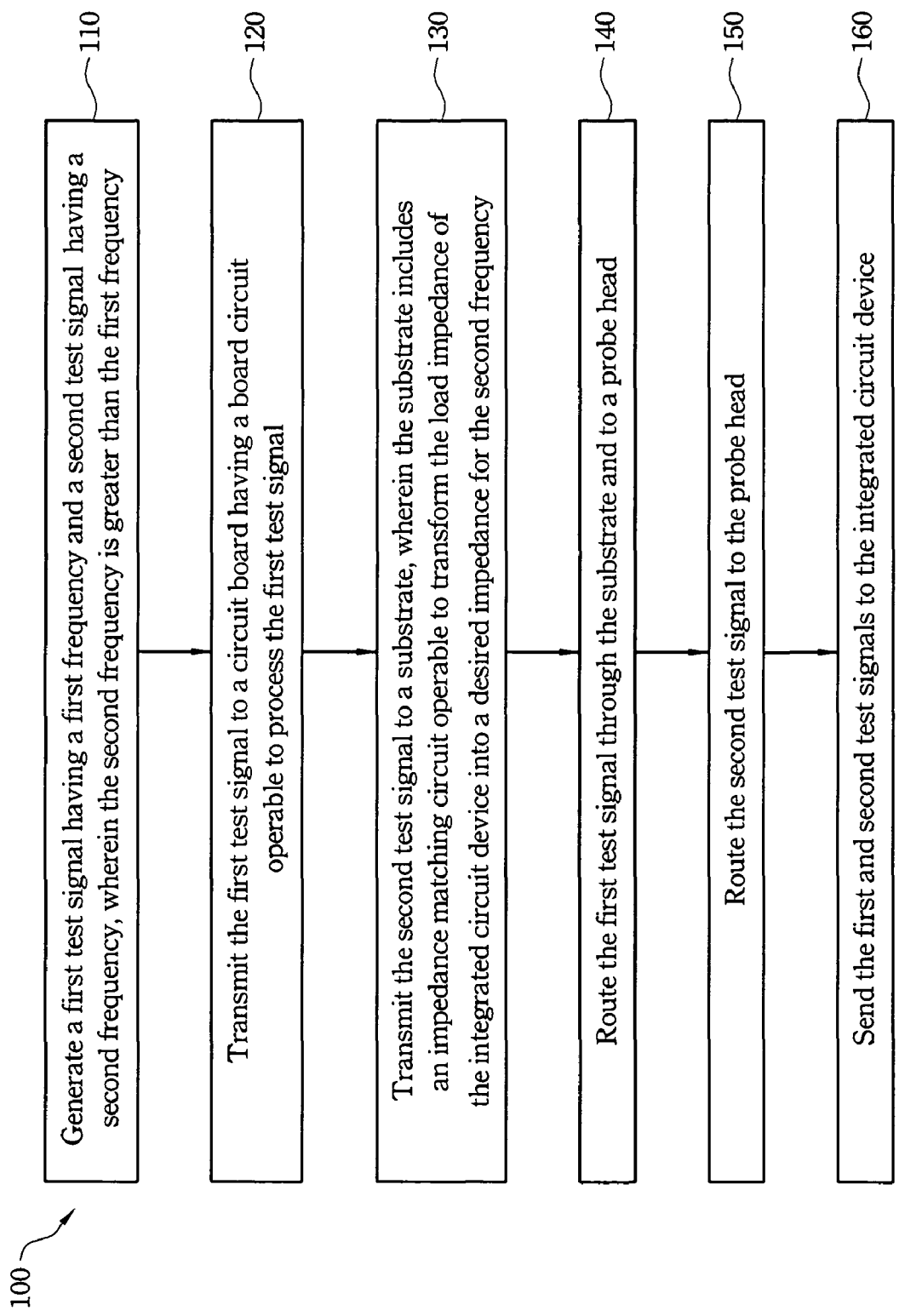
FIG. 1 is a flowchart illustrating a method for testing an IC chip according to various aspects of the present disclosure.
Figure 2:
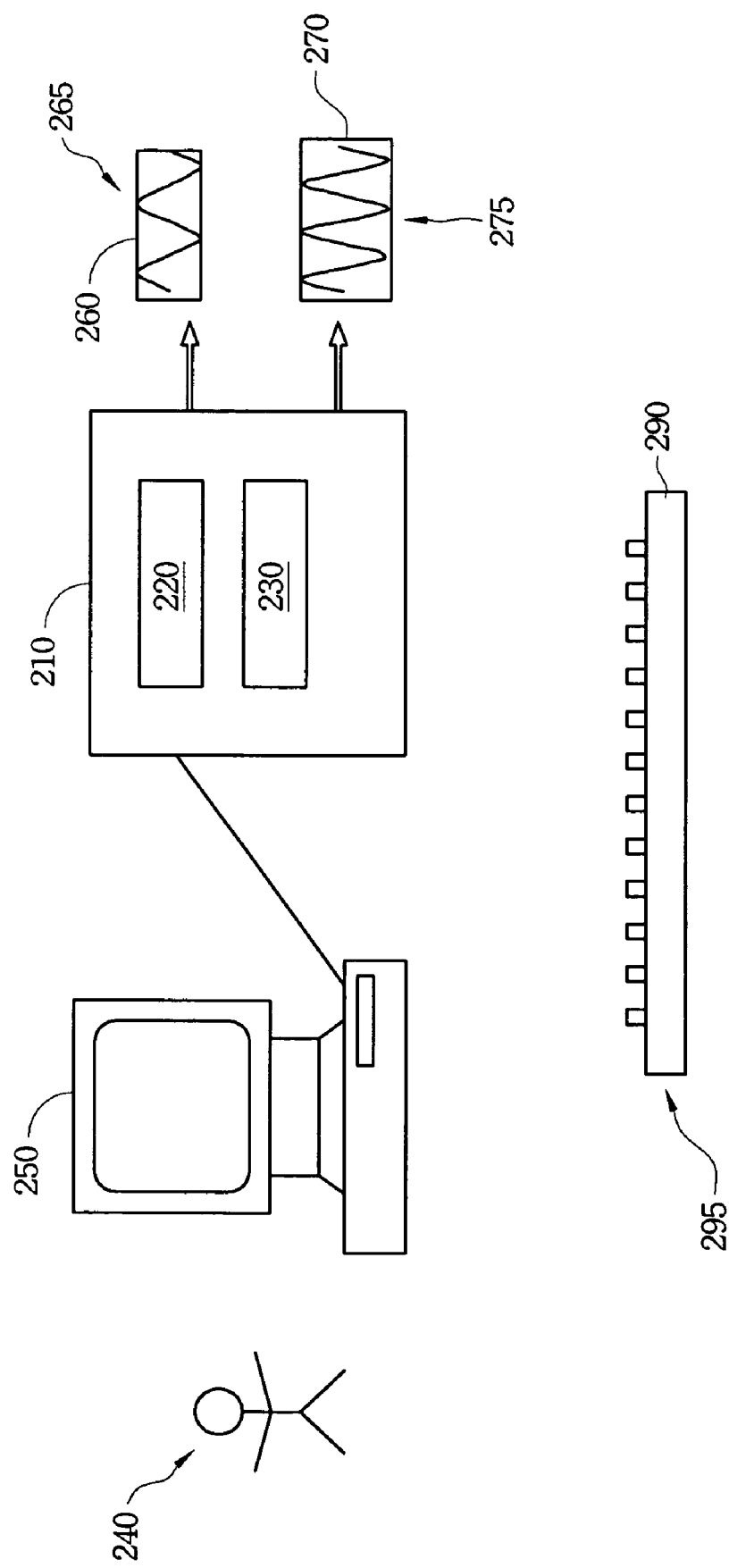
FIGS. 2-3 are diagrammatic views of a system for testing an IC chip according to various aspects of the present disclosure.
Figure 3:
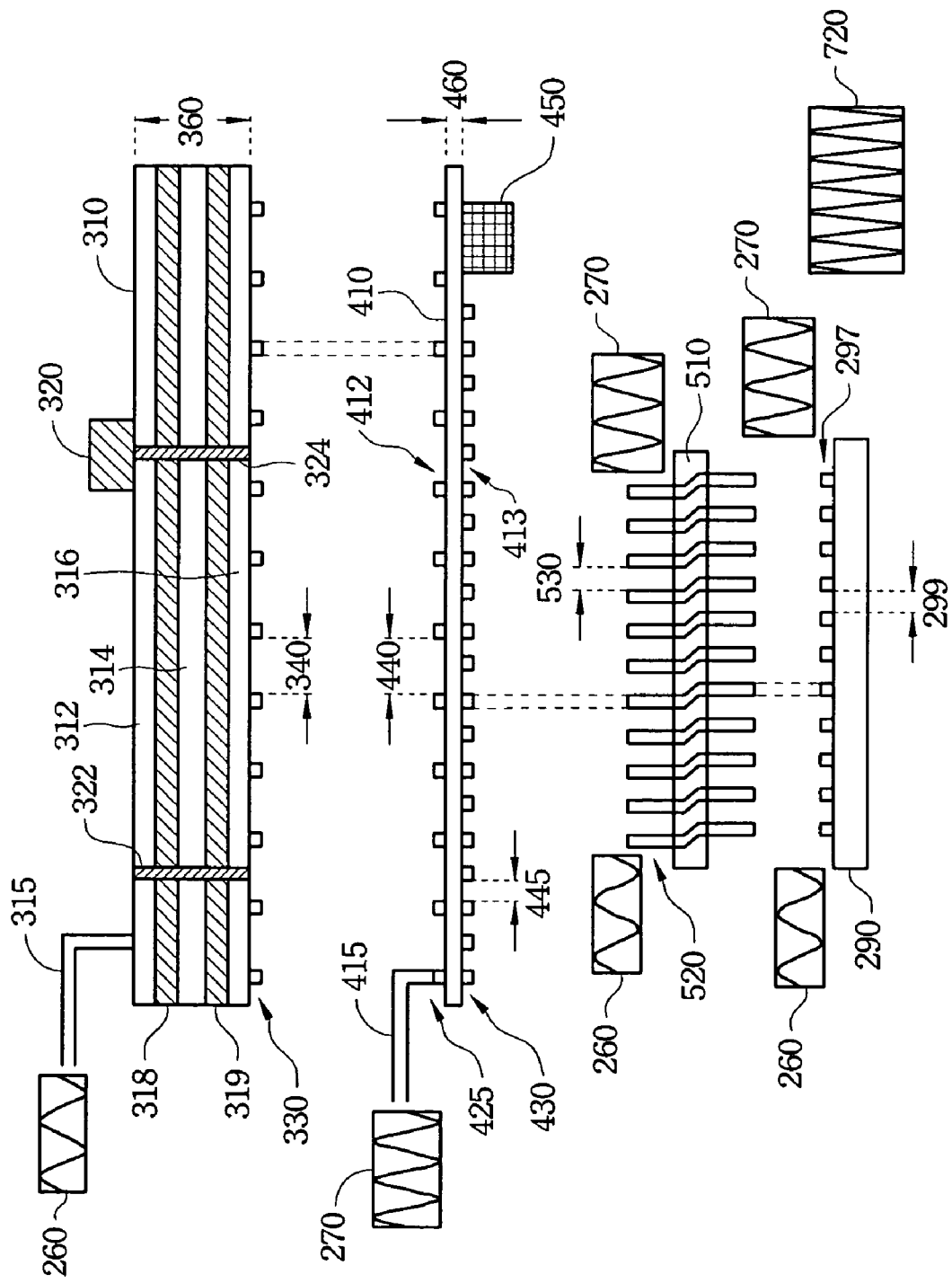
Figure 4A:
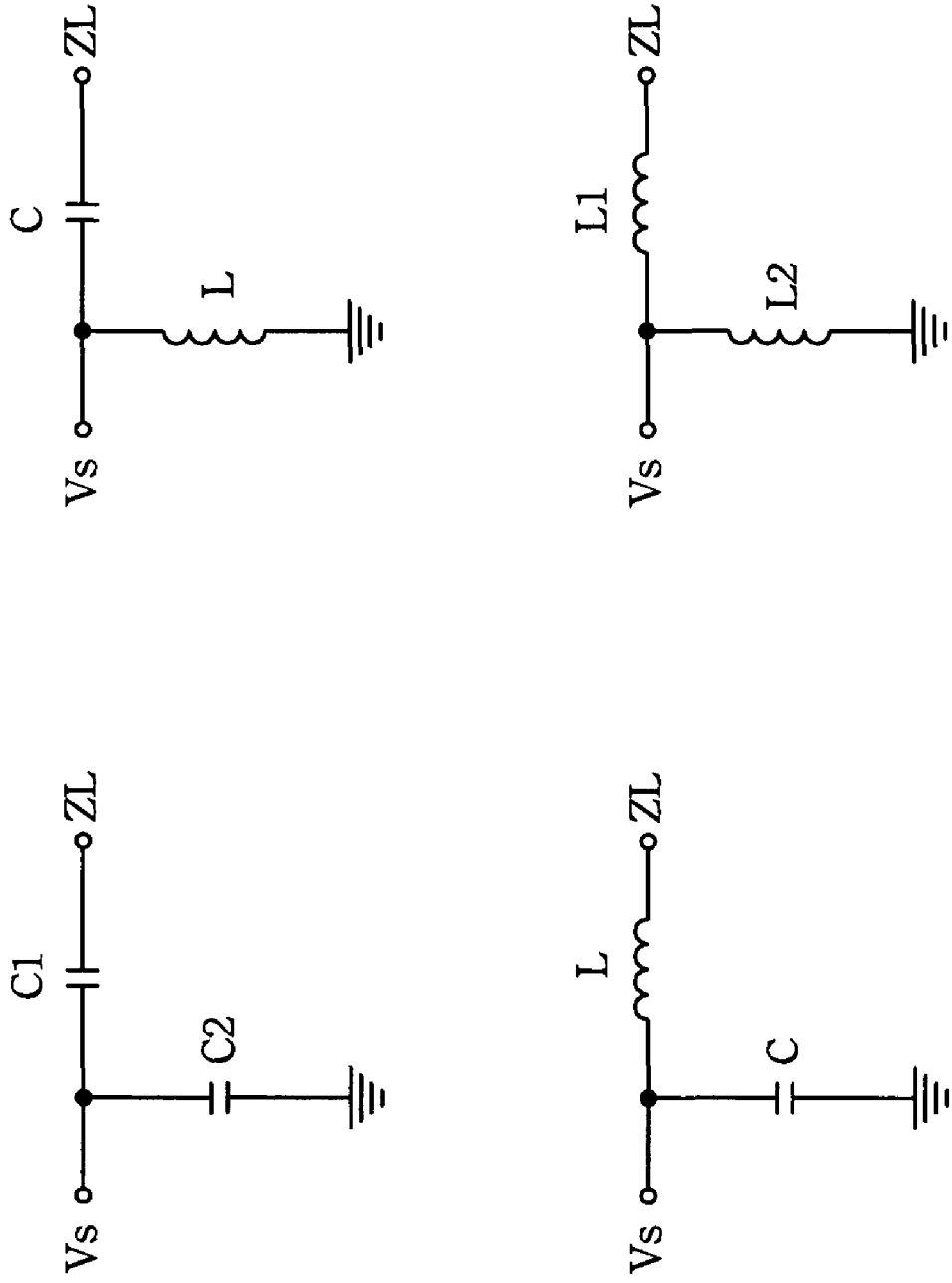
FIGS. 4A-4D are exemplary embodiments of an high frequency circuit used for testing the IC chip.
Figure 4B:
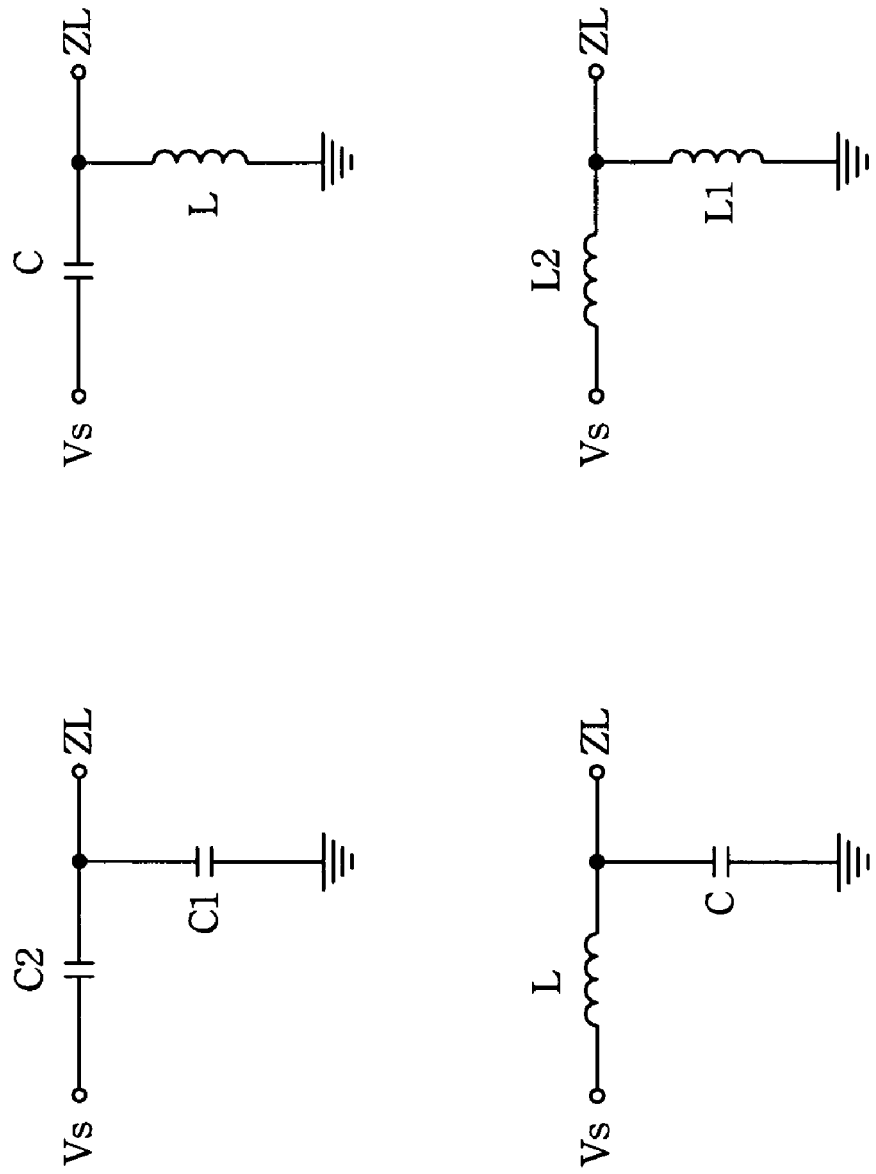
Figure 4C:
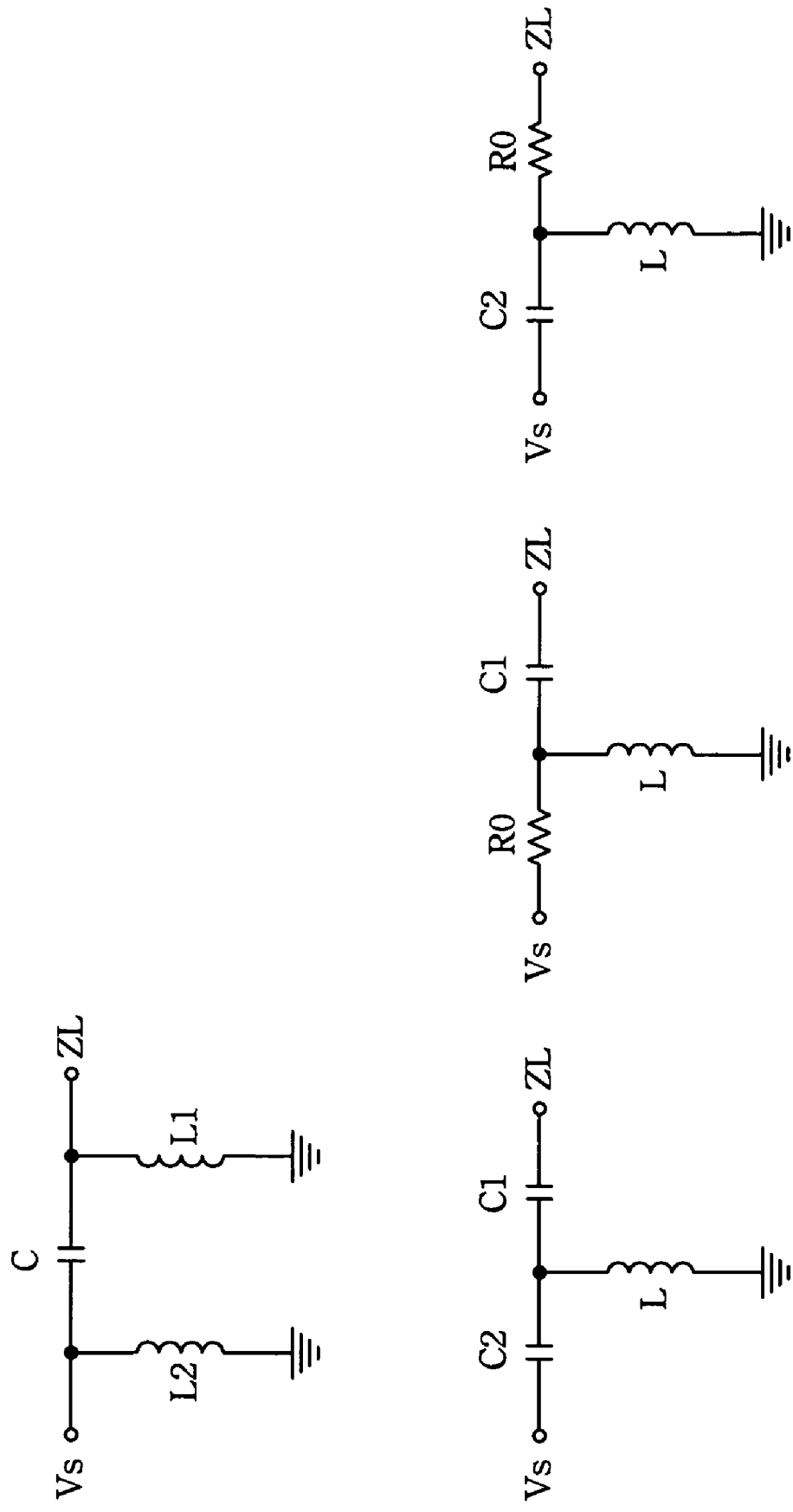
Figure 4D:
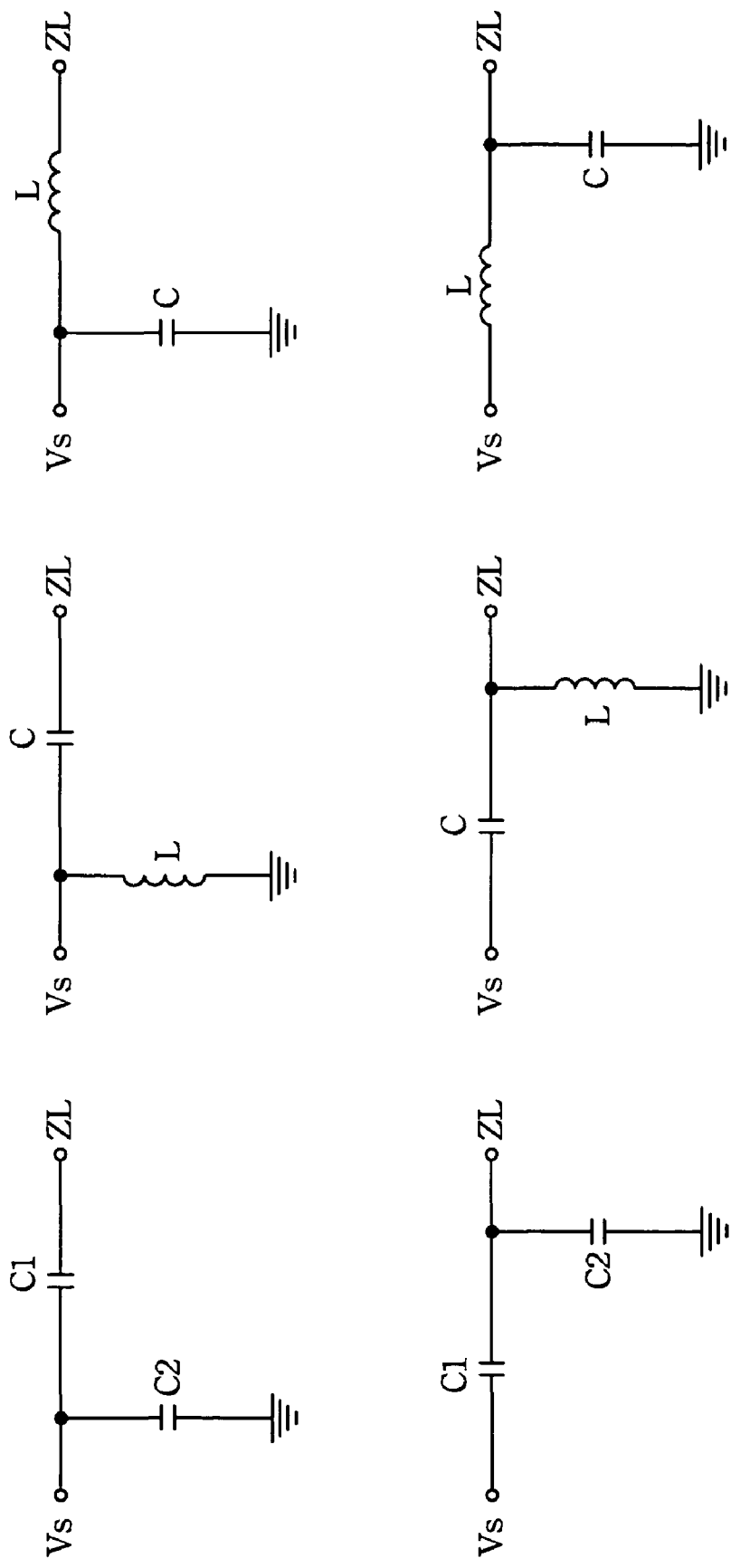

Illustrate in FIG. 1 is a flowchart of a method 100 for testing an IC chip according to various aspects of the present disclosure. FIGS. 2-3 illustrate diagrammatic views of one embodiment of a system for testing the IC chip at various stages according to the method 100 of FIG. 1. FIGS. 4A-4D illustrate exemplary embodiments of an high frequency circuit used for testing the IC chip. It should be noted that other apparatuses may be implemented in the test system but are not illustrated for the sake of clarity. It is also understood that additional processes may be provided before, during, and after the method 100 of FIG. 1, and that some other processes may only be briefly described herein.

Referring to FIG. 1, the method 100 begins with block 110 in which a first test signal having a first frequency and a second test signal having a second frequency may be generated, wherein the second frequency is greater than the first frequency. Referring to FIG. 2, a tester 210 may be used to generate test signals for testing an integrated circuit 290 having a load impedance 295. The tester 210 may also be used to receive signals from the integrated circuit 260 in response to being tested. The tester 210 may be an automatic test equipment (ATE). The tester 210 may include a plurality of high speed and high precision testing circuits 220. The tester 210 may also include a plurality of software test programs 230. The software test programs 230 may be selected or modified by an user 240 through a computer interface 250 or other suitable interface. Thus, the tester 210 has flexibility and is capable of testing a number of different IC chips by selecting the appropriate software test program 230.

In the present embodiment, the tester 210 generates a test signal 260 having a frequency 265 and another test signal 270 having a frequency 275, where the frequency 265 does not exceed the frequency 275. The test signal 260 may be used to test performance or electrical characteristics of the integrated circuit 290 other than high frequency response characteristics. For example, the test signal 260 may be used to test a baseband digital processing or power control characteristics of the integrated circuit 290. In the present embodiment, the frequency 265 associated with the test signal 260 usually does not exceed a few hundred mega-hertz (MHz). The test signal 270 may be used to test the high frequency response characteristics of the integrated circuit 290, typically in an ultra-high frequency (UHF) range or a super-high frequency (SHF) range. For example, the UHF range may span from 300 MHz to 3 GHz. The SHF range may span from 3 GHz to 30 GHz. In the present embodiment, the frequency 275 associated with the test signal 270 is greater than 800 MHz and may be as high as 3-5 GHz.

The method 100 continues with block 120 in which the first test signal is transmitted to a substrate having a board circuit operable to process the first test signal. Referring now to FIG. 3, a substrate 310 may be coupled to the tester 210. The substrate 310 may be a printed circuit board (PCB) having a plurality of conducting layers 312, 314, 316 separated by a plurality of insulating layers 318, 319. The conducting layers 312, 314, 316 and the insulating layers 318 and 319 may be planar. The conducting layers 312, 314, 316 may include copper foil. The insulating layers 318, 319 may include a dielectric material. The substrate 310 may also include a plurality of vias or contacts 322, 324 interconnecting the conductive layers 312, 314, 316. In the present embodiment, the substrate 310 includes a thickness 360 of about 6.35 mm. The substrate 310 is usually supplied by a vendor.

The test signal 260 may be transmitted to the substrate 310 through a coupling mechanism 315. This coupling mechanism 315 may include a connector and a cable. The connector may include an SNA connector, an SNB connector, an SMA connector, or other suitable connectors. The cable may include a coaxial cable or other suitable wiring. The connectors and cable may be used to route signals to and from the tester 210 and substrate 310. The substrate 310 may include a circuit 320. The circuit 320 may be used to test the integrated circuit's 290 performance/electrical characteristics other than the high frequency response characteristics. For example, the circuit 320 may include a digital processing circuit. In some other embodiments, the circuit 320 may also include a power control circuit. The circuit 320 may include ICs or discrete circuit components including capacitors, inductors, or resistors. In the present embodiment, the test signal 260 may be routed to the circuit 320 and processed by the circuit 320. The circuit 320 may be electrically coupled to a plurality of pads 330 located on the substrate 310 by way of the vias 322 and/or 324. The pads 330 may include any suitable contact pad as known in the art. The pads 330 are separated by a pitch 340. In the present embodiment, the pitch 340 includes a size of about 300 um. Also, in the present embodiment, the test signal 260 may be routed to the pads 330 after being processed by the circuit 320. It should be noted that the specified pitch above is a mere example and that other pitch sizes may be used depending on a particular vendor and limitations of the PCB.

The method 100 continues with block 130 in which the second test signal is transmitted to a substrate, wherein the substrate includes an high frequency circuit operable to transform the load impedance of the integrated circuit into a desired impedance for the second frequency. Referring to FIG. 3, a substrate 410 may be coupled to the substrate 310. The substrate 410 is typically supplied by a vendor separate from the vendor that supplies the substrate 310. The substrate 410 may include a ceramic material. Alternatively, the substrate 410 may include an organic material. In the present embodiment, the substrate 410 includes a thickness 460 of about 1.53 mm. The substrate also includes a plurality of upper surface pads 425 separated by a pitch 440, wherein the upper surface pads 425 are located on an upper surface 412 of the substrate 410. The upper surface 412 may be referred to as a ball-grid-array (BGA) side. In the present embodiment, the pitch 440 is approximately equal in size to the pitch 340 separating the pads 330 of the substrate 310. One or more of the upper surface pads 425 of the substrate 410 may be coupled to one or more of the pads 330 of the substrate 310, so that electrical signals may be transmitted and received between the substrate 410 and the substrate 310. This coupling may be done by soldering the upper surface pads 425 of the substrate with the pads 330 of the substrate 310. Accordingly, the solder may act as an interface between the substrate 310 and the substrate 410. Note that if the test signal 270 were to pass through the solder interface from the substrate 310 to the substrate 410 or vice versa, the test signal 270 may suffer signal degradation. The signal degradation may be caused by impedance mismatches.

The substrate 410 may also include a plurality of lower surface pads 430 separated by a pitch 445, wherein the lower surface pads are located a lower surface 413 of the substrate 410. The lower surface 413 may be referred to as a C4 side. In the present embodiment, the pitch 445 includes a size of about 130 um. The test signal 270 may be transmitted to the substrate 410 either directly from the tester 210 or through the substrate 310 first. In the present embodiment, the test signal 270 is transmitted to the substrate 410 through a coupling mechanism 415 and bypasses the substrate 310. This coupling mechanism 315 may include a connector and a cable. The connector may include an SNA connector, an SNB connector, or an SMA connector. The cable may include a coaxial cable. The connector and the cable may be used to route signals to and from the tester 210 and substrate 410. One advantage of this embodiment is that noise and interference signals that may be present on the substrate 310 are not coupled to the test signal 270, since the test signal 270 bypasses the substrate 310. Another advantage of this embodiment is that signal degradation of the test signal 270 may be reduced since the test signal 270 does not pass through the solder interface between the substrate 310 and the substrate 410. Consequently, a more accurate measurement of the integrated circuit's 290 high frequency response characteristics may be obtained.

The substrate 410 also includes a high frequency circuit 450. The high frequency circuit 410 may be separated from the main substrate 310. The high frequency circuit 450 may include an impedance matching circuit that couples a source and a load through one or more transmission lines having a characteristic impedance. The impedance matching circuit of the high frequency circuit 450 may include one or more inductors, capacitors, or resistors configured to transform an impedance of the load to a desired impedance seen by the source. In the present embodiment, the load may be the integrated circuit 290 having the load impedance 295, and the source may be the tester 210 that is generating the test signal 270, wherein the source has a source impedance. The impedance matching circuit of the high frequency circuit 450 may be used to reduce a high frequency signal reflection, or to maximize power transfer, or to raise the signal-to-noise ratio, or to reduce the phase and amplitude distortion, depending on the specific configuration of the high frequency circuit 450. For example, the load impedance 295 may be approximately matched to the characteristic impedance of the transmission line to reduce signal reflection. Alternatively, the load impedance 295 may be approximately matched to a complex conjugate of the source impedance to maximize power transfer. Without the impedance matching circuit of the high frequency circuit 450, it may be difficult to test the high frequency response characteristics of the integrated circuit 290, and the test results may become unreliable and invalid. Refer to FIGS. 4A-4D for various embodiments of the impedance matching circuit of the high frequency circuit 450.

The high frequency circuit 450 may also include other high frequency processing circuits operable to function in the UHF or SHF frequency ranges. For example, the high frequency circuit 450 may include oscillators for providing a high frequency signal, radio-frequency (RF) signal switches for routing high frequency signals, RF attenuators for attenuating high frequency signals, RF amplifiers for amplifying high frequency signals, mixers for mixing a plurality of signals to generate a signal with a new frequency, and filters to filter out signals in an undesired frequency range. The test signal 270 may pass through and be processed by these other circuits in the high frequency circuit 450 as well.

The method 100 continues with block 140 in which the first test signal is routed through the substrate to a probe head. Referring to FIG. 3, a probe head 510 may be coupled to the substrate 410. The probe head 510 may include a plurality of probe sensors 520 separated by a pitch 530. In the present embodiment, the pitch 530 is approximately equal in size to the pitch 445 separating the lower surface pads 430 of the substrate 410, wherein the pitch 530 is about 130 um. Also, in the present embodiment, the test signal 260 is routed from the pads 340 of the substrate 310 to the upper surface pads 425 of the substrate 410. Then the test signal 260 is routed from the upper surface pads 425 to the lower surface pads 430 of the substrate 410. Thereafter, the test signal 260 is routed to the probe sensors 520 of the probe head 510.

The method 100 continues with block 150 in which the second test signal is routed to the probe head. Referring to FIG. 3, the test signal 270 is routed through the high frequency circuit 450. The test signal 270 is then routed to the lower surface pads 430 and then routed to the probe sensors 520 of the probe head 510.

The method 100 continues with block 160 in which the first and second test signals are sent to the integrated circuit. Referring now to FIG. 3, the integrated circuit 290 may include a plurality of pins 297, wherein adjacent pins 297 are separated by a pitch 299. In the present embodiment, the pitch 299 is approximately equal in size to the pitch 530 that separates the probe sensors 520. The probe sensors 520 are electrically coupled to the pins 297, and the test signals 260 and 270 are then sent to the integrated circuit 290 via the probe sensors 520 and the pins 297. The signals 260 and 270 may then be processed by the integrated circuit 290.

It is understood that the method 100 may continue with additional steps to complete the testing of the integrated circuit 290. For example, after the test signals 260 and 270 are processed by the integrated circuit 290, the integrated circuit 290 may generate one or more response signals 720. The signal 720 may be received by the probe head 510 through the probe sensors 520. The test signal 720 may then be routed back to the tester 210 through the substrate 410 and the substrate 310 and may pass through and be processed by the high frequency circuit 450. Based on the response signals 720 and the test signals 260 and 270, the tester 210 may complete a measurement of one or more performance characteristics of the integrated circuit 290.

The present embodiment offers several advantages over prior art devices. One advantage of the present embodiment is that it allows having a small pitch size for a probe head, which allows testing of ICs that have many pins (e.g., more than 1500 pins) separated by a small pitch (e.g., 130 um). Another advantage of the present embodiment is that it is capable of testing devices that operate in a high frequency range, for example, a frequency range as high as 3-5 GHz. Yet another advantage of the present embodiment is that the lead time is shorter, typically 5-7 weeks compared to a lead time of 8-10 weeks for prior art devices. One more advantage of the present embodiment is that it is easy to implement. Yet another advantage of the present embodiment is that it may have a lower manufacturing cost.

In summary, the methods and devices disclosed provide an effective and efficient approach to test an integrated circuit. The method disclosed herein takes advantage of placing an high frequency circuit including an impedance matching circuit on a substrate. Further, the devices and apparatuses disclosed herein are inexpensive and easy to implement. It is understood that different embodiments disclosed herein offer different advantages, and that no particular advantage is necessarily required for all embodiments.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for testing an integrated circuit having a load impedance, comprising:
  generating a first test signal having a first frequency and a second test signal having a second frequency, wherein the second frequency is greater than the first frequency;

providing the first test signal to a first substrate, the first substrate having a circuit operable to process the first test signal;

providing the second test signal to a second substrate having an impedance matching circuit, the impedance matching circuit being operable to transform the load impedance into a desired impedance for the second frequency, wherein the providing of the second test signal to the second substrate includes bypassing the second test signal from the first substrate and routing the second test signal through the impedance matching circuit; and sending the first and second test signals to the integrated circuit via the second substrate.

2. The method of claim 1, wherein the sending of the first and second test signals includes routing the first test signal through the second substrate and to a probe head, and routing the second test signal to the probe head, the probe head being electrically coupled to the integrated circuit.

3. The method of claim 2, further including:

processing the first and second test signals with the integrated circuit;

generating a response signal with the integrated circuit;

routing the response signal to a tester through the second substrate and the first substrate, wherein the tester is operable to generate the first and second test signals and receive the response signal; and measuring a characteristic of the integrated circuit based on the first and second test signals and the response signal.

4. The method of claim 3, further including matching the load impedance of the integrated circuit approximately to a characteristic impedance of a transmission line, wherein the transmission line couples the impedance matching circuit to the integrated circuit and the tester.

5. The method of claim 3, further including matching the load impedance of the integrated circuit approximately to a complex conjugate of a source impedance of the tester.

6. An apparatus for testing an integrated circuit having a load impedance and a plurality of pins separated by a first pitch, comprising:

a first substrate operable to process a first test signal having a first frequency;

a second substrate coupled to the first substrate, the second substrate being operable to process a second test signal having a second frequency, wherein the first frequency does not exceed the second frequency, wherein the second substrate includes a first coupling mechanism operable to route the second test signal, wherein the second test signal bypasses the first substrate before being routed by the coupling mechanism; and an impedance matching circuit located on the second substrate, wherein the impedance matching circuit is operable to transform the load impedance into a desired impedance for the second frequency.

7. The apparatus of claim 6, wherein the first substrate includes a plurality of pads separated by a second pitch, the second pitch being greater than the first pitch.

8. The apparatus of claim 7, wherein the second substrate includes a plurality of upper surface pads and a plurality of lower surface pads, wherein one or more of the upper surface pads are electrically coupled to one or more of the lower surface pads.

9. The apparatus of claim 8, wherein the upper surface pads are separated by a pitch substantially the same as a size of the second pitch.

10. The apparatus of claim 9, wherein the lower surface pads are separated by a pitch substantially the same as a size of the first pitch.

11. The apparatus of claim 9, wherein the upper surface pads are located on a BGA side of the second substrate, and wherein the lower surface pads are located on a C4 side of the second substrate.

12. The apparatus of claim 11, further including a high frequency processing circuit located on the second substrate, wherein the high frequency processing circuit is operable to function in an RF range and is operable to process the second test signal.

13. The apparatus of claim 11, wherein the high frequency processing circuit includes an oscillator, a mixer, a filter, a low-noise-amplifier, an RF switch, an RF attenuator, an RF amplifier, or a combination thereof.

14. The apparatus of claim 13, wherein the high frequency processing circuit and the impedance matching circuit are located on the C4 side of the second substrate.

15. The apparatus of claim 14, further including a second coupling mechanism located on the BGA side of the second substrate, wherein the coupling mechanism is operable to couple the second substrate to a tester.

16. A system for testing an integrated circuit having a load impedance and a plurality of pins separated by a first pitch, comprising:

a tester having a source impedance and operable to generate a first test signal having a first frequency and a second test signal having a second frequency for testing the integrated circuit, wherein the second frequency is greater than the first frequency;

a first substrate coupled to the tester and operable to process the first test signal;

a second substrate coupled to the first substrate and operable to process the second test signal, wherein the second substrate includes an impedance matching circuit operable to transform the load impedance into a desired impedance for the second frequency, wherein the second substrate includes a coupling mechanism operable to route the second test signal, wherein the second test signal bypasses the first substrate before being routed by the coupling mechanism; and a probe head having a plurality of probe sensors operable to transmit and receive the first and second test signals, wherein the probe sensors couple the second substrate to the integrated circuit.

17. The system of claim 16, wherein the second frequency includes frequencies from an UHF range and an SHF range.

18. The system of claim 16, wherein the second substrate includes a plurality of lower surface pads that are separated by the first pitch and a plurality of upper surface pads that are separated by a second pitch greater than the first pitch; and wherein the first substrate includes a plurality of pads that are separated by the second pitch for electrically coupling to the plurality of upper surface pads of the second substrate.

* * * * *